(12) United States Patent
Herb et al.

(10) Patent No.: US 6,568,991 B2
(45) Date of Patent: May 27, 2003

(54) METHOD AND APPARATUS FOR SENSING A WAFER IN A CARRIER

(75) Inventors: John D. Herb, Phoenix, AZ (US); Ned W. Teeny, Chandler, AZ (US); Stephen C. Schultz, Gilbert, AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/941,110

(22) Filed: Aug. 28, 2001

(65) Prior Publication Data

US 2003/0045205 A1 Mar. 6, 2003

(51) Int. Cl.⁷ ............................................... B24B 49/00
(52) U.S. Cl. .................. 451/6; 451/289; 451/8
(58) Field of Search .................. 451/6, 5, 41, 60, 451/289, 296, 286, 388, 8

(56) References Cited

U.S. PATENT DOCUMENTS

| | | | |
|---|---|---|---|
| 4,272,924 A | | 6/1981 | Masuko et al. |
| 5,163,312 A | | 11/1992 | Ayers |
| 5,554,064 A | * | 9/1996 | Breivogel et al. ............ 451/41 |
| 5,733,171 A | | 3/1998 | Allen et al. |
| 5,762,536 A | * | 6/1998 | Pant et al. ...................... 451/6 |
| 5,816,900 A | * | 10/1998 | Nagahara et al. ............ 154/285 |
| 5,834,645 A | | 11/1998 | Bartels et al. |
| 5,957,751 A | * | 9/1999 | Govzman et al. .............. 451/8 |
| 6,264,532 B1 | | 7/2001 | Meloni |
| 6,398,621 B1 | * | 6/2002 | Zuniga et al. ................. 451/8 |
| 6,416,402 B1 | * | 7/2002 | Moore ......................... 451/60 |

* cited by examiner

Primary Examiner—Dung Van Nguyen
(74) Attorney, Agent, or Firm—Ingrassia Fisher & Lorenz, P.C.

(57) ABSTRACT

The invention is a carrier that determines if a wafer has been properly loaded. The carrier includes a body having a cavity covered by a membrane, thereby forming an initial plenum. One or more annular ribs may extend from the body to the membrane to divide the initial plenum into a plurality of plenums. A sensor is positioned within one of the plenums to detect the presence of the wafer. Pump(s) with pressure regulators may be used to pressurize the plenum(s). A first plenum may be pressurized sufficient to hold the wafer to the membrane by creating a partial vacuum between the membrane and the wafer. A second plenum may be pressurized sufficient to urge the membrane away from the sensor if the wafer is not properly loaded in the carrier. If the membrane is near the sensor, the wafer has been properly loaded into the carrier.

40 Claims, 16 Drawing Sheets

METHOD AND APPARATUS FOR SENSING A WAFER IN A CARRIER

FIELD OF THE INVENTION

The present invention generally relates to polishing a surface of a workpiece. More particularly, the invention relates to improved methods and apparatus for detecting the presence of a wafer in a carrier.

BACKGROUND OF THE INVENTION

Chemical mechanical polishing or planarizing a surface of an object may be desirable for several reasons. For example, chemical mechanical polishing is often used in the formation of microelectronic devices to provide a substantially smooth, planar surface suitable for subsequent fabrication processes such as photoresist coating and pattern definition. Chemical mechanical polishing may also be used to form microelectronic features. For example, a conductive feature such as a metal line or a conductive plug may be formed on a surface of a wafer by forming trenches and vias on the wafer surface, depositing conductive material over the wafer surface and into the trenches and vias, and removing the conductive material on the surface of the wafer using chemical mechanical polishing, leaving the vias and trenches filled with the conductive material.

A typical chemical mechanical polishing apparatus suitable for planarizing the semiconductor surface generally includes a wafer carrier configured to support, guide, and apply pressure to a wafer during the polishing process; a polishing compound such as a slurry containing abrasive particles and chemicals to assist removal of material from the surface of the wafer; and a polishing surface such as a polishing pad. In addition, the polishing apparatus may include an integrated wafer cleaning system and/or an automated load and unload station to facilitate automatic processing of the wafers.

A wafer surface is generally polished by moving the surface of the wafer to be polished relative to the polishing surface in the presence of the polishing compound. In particular, the wafer is placed in the carrier such that the surface to be polished is placed in contact with the polishing surface and the polishing surface and the wafer are moved relative to each other while slurry is supplied to the polishing surface.

The wafer is typically placed in the carrier by a robot or other mechanical means. Conventional carriers have a retaining ring surrounding either an elastic surface supported by a rigid pressure plate or a membrane supported by one or more pressurized plenums. The retaining ring and elastic surface or membrane form a pocket for receiving the wafer. A vacuum is typically applied to the back surface of the wafer through one or more apertures in the rubber surface or membrane for holding the wafer in the carrier.

Occasionally, the wafer is improperly positioned in the carrier or the vacuum is insufficient to properly retain the wafer in the carrier. It is important to verify the wafer is properly held before the start of the polishing process to prevent damage to the wafer or the polishing tool. The aperture(s) allow the vacuum level to be checked to determine if the wafer is present. If the wafer is properly held by the carrier, the wafer will block the aperture(s) thereby maintaining the vacuum. However, if the wafer becomes dislodged, the wafer will not block the aperture(s) and the vacuum level will not be maintained.

After processing, it is typically desirable to remove the wafer from the carrier to allow processing of subsequent wafers. The wafer often sticks to the rubber surface or membrane and may not be easily dislodged from the carrier. The aperture provides a path for pressurized air to be used to blow the wafer off the carrier.

Applicants have noticed several problems with using the aperture of the prior art. The aperture creates a point of nonuniform pressure on the back surface of the wafer. This nonuniform pressure on the back surface of the wafer could result in a nonuniform removal of material on the front surface of the wafer. Another problem noticed by the applicants is that the pressurized air used to dislodge the wafer may impart particles previously sucked into the air lines while holding another wafer on the back surface of the present wafer. The pressurized air may also dry particles already on the back surface of the wafer thereby making the particles more difficult to remove. The particles can contaminate the wafer and hinder further processing of the wafer.

What is needed is an apparatus and method for verifying the presence of a wafer in a carrier that does not hinder the processing of the wafer and that does not impart or adhere particles to the wafer.

SUMMARY OF THE INVENTION

The present invention provides improved methods and apparatus for chemical mechanical polishing of a surface of a workpiece that overcome many of the shortcomings of the prior art. While the ways in which the present invention addresses the drawbacks of the now-known techniques for chemical mechanical polishing will be described in greater detail hereinbelow, in general, in accordance with various aspects of the present invention.

A carrier may be used to retain a wafer during a polishing or planarizing process of a front surface of the wafer. The carrier may advantageously be configured to also detect the presence of the wafer in the carrier. The carrier includes a body having a shallow recess or cavity. The body provides structural support for the carrier. The body may also be connected to the rest of the tool via a shaft for pressing and possibly rotating the body. In one particular embodiment, the shaft is connected to a carousel apparatus for transporting the carrier from one station to another station within the tool.

A membrane may be positioned over the cavity to form an initial plenum between the body and the membrane. The membrane is used to support the back surface of the wafer during the polishing process. The membrane is preferably a flexible resilient film comprising an elastic surface of uniform thickness. However, the membrane may have variations in thickness or even a notch for receiving a portion of the sensor if this improves the detection capability of the sensor or the polishing process.

A sensor may be positioned within the initial plenum for detecting the presence of the wafer. The sensor may be, for example, an inductive or mechanical sensor, but is preferably a capacitive sensor mounted to the body. The size of a capacitive sensor positioned within the plenum may be reduced by positioning the sensor's amplifier outside of the plenum. The sensor is preferably connected to a control system that may act upon the information acquired from the sensor.

In a preferred embodiment, one or more dividers, preferably annular ribs, may extend from the body to the membrane to divide the initial plenum into a plurality of plenums. The dividers or annular ribs allow the carrier to have a plurality of zones that may be used to apply different urging forces on different areas of the back surface of the wafer. These multizone carriers greatly improve the flexibility of the polishing process. For even greater process flexibility, independently controllable plenums may be created behind the annular ribs to control the urging forces on different areas of the back surface of the wafer adjacent to the ribs.

One or more pumps having one or more pressure regulators may be used to pressurize the initial plenum, plurality of plenums in the carrier or plenums behind the ribs through pathways during a wafer detection process or the polishing process. The pumps with pressure regulators and pathways to the plenum(s) may be configured in a variety of ways, but they are preferably configured so that the pressure within each plenum is independently controllable.

A platen supporting a polishing surface may also be used during the polishing process of the wafer. A manifold may be positioned beneath the platen to distribute a fluid across the platen to the polishing surface during the polishing process. The fluid may be uniformly distributed or distributed in a desired manner to improve the polishing process.

A motion generator may be connected to the platen for generating relative motion between the wafer and the polishing surface. The motion generator may, for example, orbit, rotate or linearly move the polishing surface.

In operation it may be determined whether a wafer is retained by a carrier by positioning the back surface of the wafer against the membrane of the carrier and sensing through the membrane, preferably via a capacitive sensor, whether the wafer is present. If the wafer is detected, the wafer is properly retained and the polishing process may continue. However, if the wafer is not detected, the wafer has not been properly retained and the polishing process may be terminated.

A more sophisticated method of determining whether a wafer is retained by a carrier may be used with a multizone carrier. The back surface of the wafer is once again positioned against the membrane of the carrier. A first pressure may be applied in a first plenum sufficient to retain the wafer by creating a partial vacuum between the membrane and the wafer. The partial vacuum is created by the pressure pulling the membrane away from the back surface of the wafer in the region of the first plenum. The sensor may be used at this time to detect the presence of the wafer through the membrane, but preferably, a second pressure may be applied in a second plenum sufficient to urge the membrane away from the sensor. The presence of the membrane adjacent the sensor may thus be used to detect the presence of the wafer. If the membrane has moved away from the sensor, the wafer is not holding the membrane against the sensor and thus has not been properly retained. If the membrane remains adjacent to the sensor, the wafer has been properly retained. Care should be taken to make sure the second pressure in the second plenum is sufficient to urge the membrane away from the sensor if the wafer is not present, but insufficient to dislodge the wafer from the carrier if the wafer is present. The pressure within each plenum may need to be optimized depending on, for example, the size and location of the plenums and the flexibility of the membrane. If the membrane is touching or near the sensor, the wafer is properly retained and the polishing process may continue. However, if the membrane has been urged away from the sensor in the second plenum, the wafer has not been properly retained and the polishing process may be terminated.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
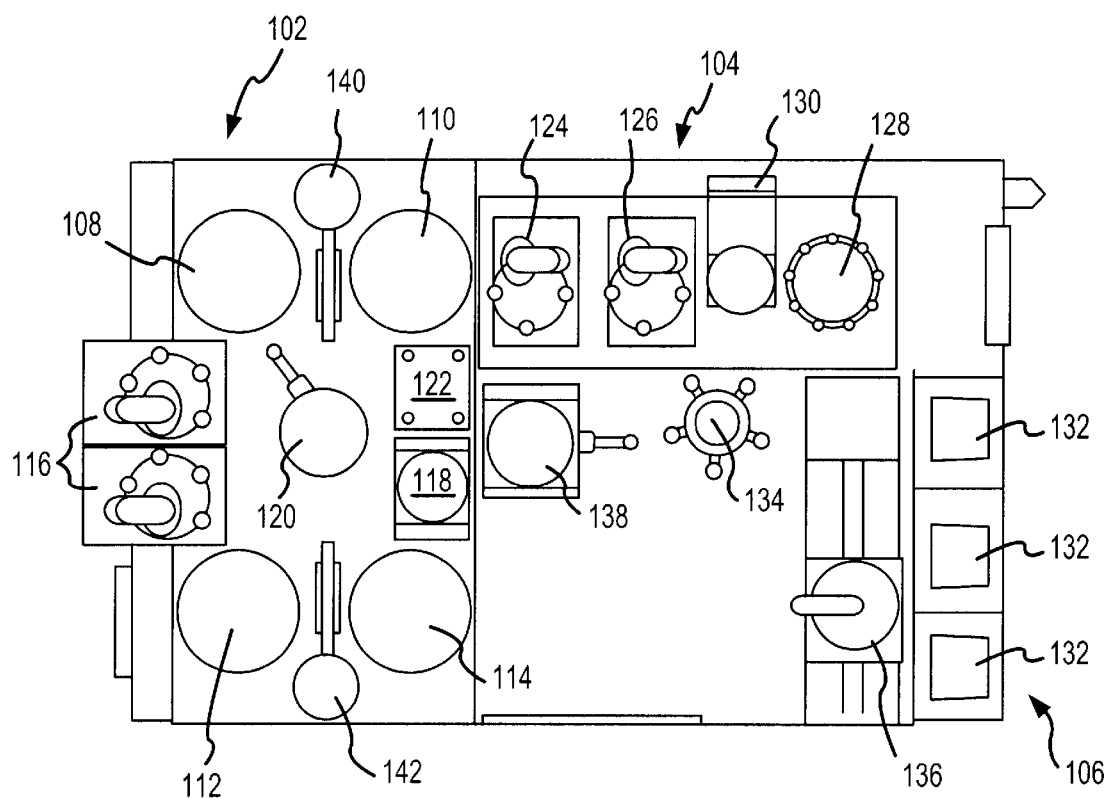
FIG. 1 illustrates a top cut-away view of a polishing system in accordance with the present invention.

FIG. 1 illustrates a top cut-way view of a polishing apparatus 100, suitable for removing material from a surface of a workpiece, in accordance with the present invention. Apparatus 100 includes a multi-platen polishing system 102, a clean system 104, and a wafer load and unload station 106. In addition, apparatus 100 includes a cover (not illustrated) that surrounds apparatus 100 to isolate apparatus 100 from the surrounding environment. In accordance with a preferred embodiment of the present invention machine 100 is a Momentum machine available from SpeedFam-IPEC Corporation of Chandler, Ariz. However, machine 100 may be any machine capable of removing material from a workpiece surface.

Although the present invention may be used to remove material from a surface of a variety of workpieces such as magnetic discs, optical discs, and the like, the invention is conveniently described below in connection with removing material from a surface of a wafer. In the context of the present invention, the term "wafer" shall mean semiconductor substrates, which may include layers of insulating, semiconducting, and conducting layers or features formed thereon, used to manufacture microelectronic devices.

Exemplary polishing system 102 includes four polishing stations 108, 110, 112, and 114, which each operate independently; a buff station 116; a transition stage 118; a robot 120; and optionally, a metrology station 122. Polishing stations 108–114 may be configured as desired to perform specific functions as described herein. The remaining polishing stations may be configured for chemical mechanical polishing, electrochemical polishing, electrochemical deposition, or the like.

Polishing system 102 also includes polishing surface conditioners 140, 142. The configuration of conditioners 140, 142 generally depends on the type of polishing surface to be conditioned. For example, when the polishing surface comprises a polyurethane polishing pad, conditioners 140, 142 suitably include a rigid substrate coated with diamond material. Various other surface conditioners may also be used in accordance with the present invention.

Clean system 104 is generally configured to remove debris such as slurry residue and material removed from the wafer surface during polishing. In accordance with the illustrated embodiment, system 104 includes clean stations 124 and 126, a spin rinse dryer 128, and a robot 130 configured to transport the wafer between clean stations 124, 126 and spin rinse dryer 128. In accordance with one aspect of this embodiment, each clean station 124 and 126 includes two concentric circular brushes, which contact the top and bottom surfaces of a wafer during a clean process.

Figure 2:
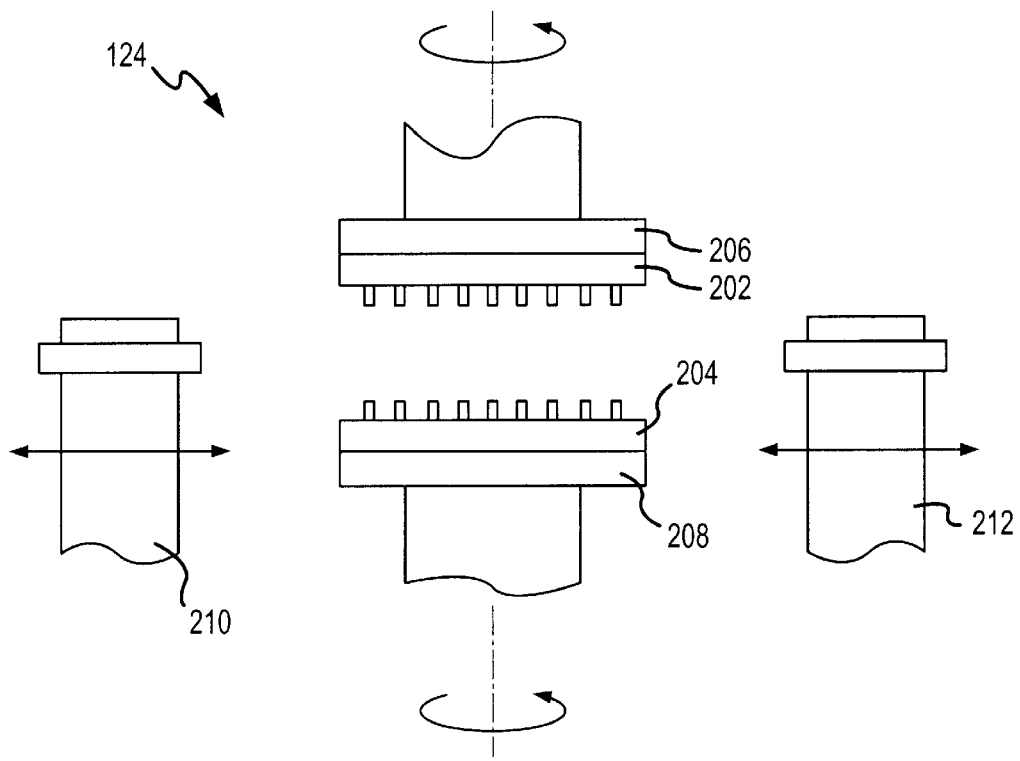
FIG. 2 illustrates a side view of a portion of a clean system for use with the apparatus of FIG. 1.

FIG. 2 illustrates an exemplary clean station (e.g., station 124) in greater detail. Clean station 124 includes brushes 202, 204 mounted to brush platens 206, 208. Station 124 also includes movable rollers—e.g., capstan rollers 210, 212—to keep the wafer in place during the clean process.

In accordance with one embodiment of the invention, during the clean operation, a wafer is placed onto the capstan rollers, and lower clean platen 208 and brush 204 rise to contact and apply pressure to a lower surface of the wafer, while upper platen 206 and brush 202 lower to contact the upper surface of the wafer The brushes are then caused to rotate about their axes to scour the surfaces of the wafer in the presence of a cleaning fluid such as deionized water and/or a $NH_4OH$ solution.

Wafer load and unload station 106 is configured to receive dry wafers for processing in cassettes 132. In accordance with the present invention, the wafers are dry when loaded onto station 106 and are dry before return to station 106.

In accordance with an alternate embodiment of the invention, clean system 104 may be separate from the polishing apparatus. In this case, load station 106 is configured to receive dry wafers for processing, and the wafers are held in a wet (e.g., deionized water) environment until the wafers are transferred to the clean station.

In operation, cassettes 132, including one or more wafers, are loaded onto apparatus 100 at station 106. A wafer from one of cassettes 132 is transported to a stage 134 using a dry robot 136. A wet robot 138 retrieves the wafer at stage 134 and transports the wafer to metrology station 122 for film characterization or to stage 118 within polishing system 102. In this context, a "wet robot" means automation equipment configured to transport wafers that have been exposed to a liquid or that may have liquid remaining on the wafer and a "dry robot" means automation equipment configured to transport wafers that are substantially dry. Robot 120 picks up the wafer from metrology station 122 or stage 118 and transports the wafer to one of polishing stations 108–114 for chemical mechanical polishing.

After polishing, the wafer is transferred to buff station 116 to further polish the surface of the wafer. The wafer is then transferred (optionally to metrology station 122 and) to stage 118, which keeps the wafers in a wet environment, for pickup by robot 138. Once the wafer is removed from the polishing surface, conditioners 140,142 may be employed to condition the polishing surface. Conditioners 140, 142 may also be employed prior to polishing a wafer to prepare the surface for wafer polishing.

After a wafer is placed in stage 118, robot 138 picks up the wafer and transports the wafer to clean system 104. In particular, robot 138 transports the wafer to robot 130, which in turn places the wafer in one of clean stations 124, 126. The wafer is cleaned using one or more stations 124, 126 and is then transported to spin rinse dryer 128 to rinse and dry the wafer prior to transporting the wafer to load and unload station 106 using robot 136.

Figure 3:
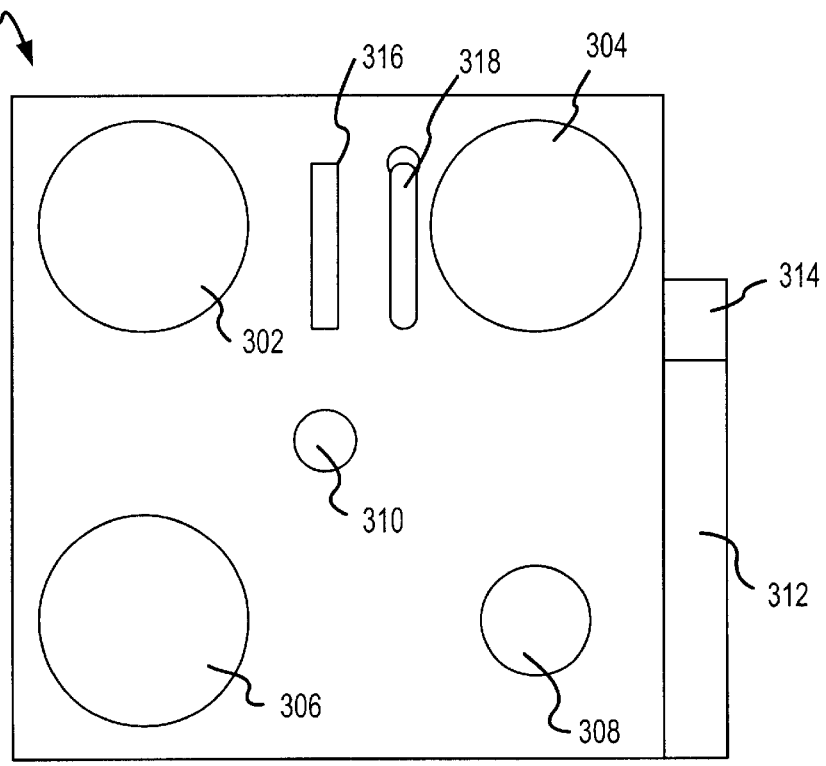
FIG. 3 illustrates a top cut-away view of a polishing system in accordance with another embodiment of the invention.
Figure 4:
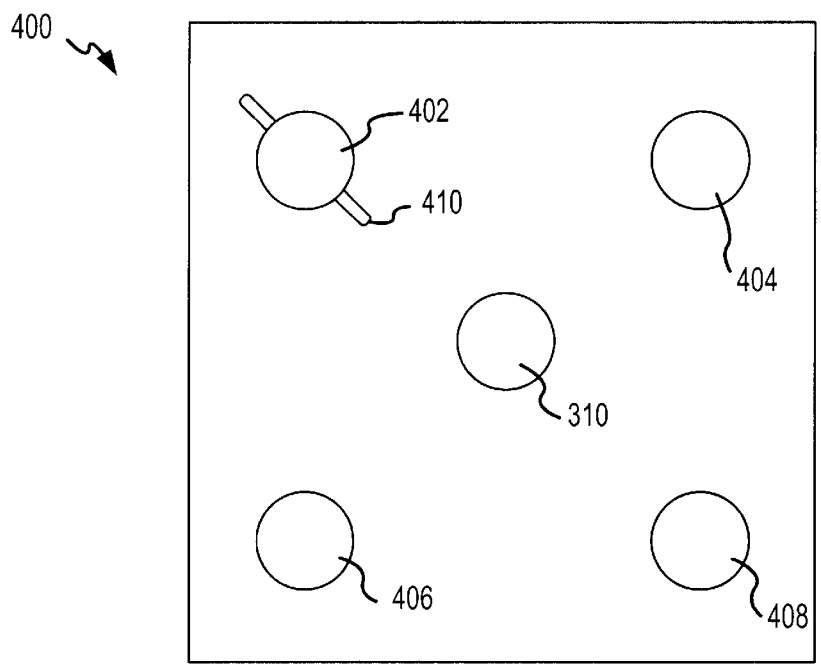
FIG. 4 illustrates a bottom view of a carrier carousel for use with the apparatus illustrated in FIG. 3.

FIG. 3 illustrates a top cut-away view of another exemplary polishing apparatus 300, configured to remove material from a wafer surface. Apparatus 300 is suitably coupled to carousel 400, illustrated in FIG. 4, to form an automated chemical mechanical polishing system. A chemical mechanical polishing system in accordance with this embodiment may also include a removable cover (not illustrated in the figures) overlying apparatus 300 and 400.

Apparatus 300 includes three polishing stations 302, 304, and 306, a wafer transfer station 308, a center rotational post 310, which is coupled to carousel 400, and which operatively engages carousel 400 to cause carousel 400 to rotate, a load and unload station 312, and a robot 314 configured to transport wafers between stations 312 and 308. Furthermore, apparatus 300 may include one or more rinse washing stations 316 to rinse and/or wash a surface of a wafer before or after a polishing process and one or more pad conditioners 318. Although illustrated with three polishing stations, apparatus 300 may include any desired number of polishing stations and one or more of such polishing stations may be used to buff a surface of a wafer as described herein. Furthermore, apparatus 300 may include an integrated wafer clean and dry system similar to system 104 described above.

Wafer transfer station 308 is generally configured to stage wafers before or between polishing processes and to load and unload wafers from wafer carriers described below. In addition, station 308 may be configured to perform additional functions such as washing the wafers and/or maintaining the wafers in a wet environment.

Carousel apparatus 400 includes polishing heads 402, 404, 406, and 408, each configured to hold a single wafer. In accordance with one embodiment of the invention, three of carriers 402–408 are configured to retain and urge the wafer against a polishing surface (e.g., a polishing surface associated with one of stations 302–306) and one of carriers 402–408 is configured to transfer a wafer between a polishing station and stage 308. Each carrier 402–408 is suitably spaced from post 310, such that each carrier aligns with a polishing station or station 308. In accordance with one embodiment of the invention, each carrier 402–408 is attached to a rotatable drive mechanism using a gimbal system (not illustrated), which allows carriers 402–408 to cause a wafer to rotate (e.g., during a polishing process). In addition, the carriers may be attached to a carrier motor assembly that is configured to cause the carriers to translate—e.g., along tracks 410. In accordance with one aspect of this embodiment, each carrier 402–408 rotates and translates independently of the other carriers.

In operation, wafers are processed using apparatus 300 and 400 by loading a wafer onto station 308, from station 312, using robot 314. When a desired number of wafers are loaded onto the carriers, at least one of the wafers is placed in contact with a polishing surface. The wafer may be positioned by lowering a carrier to place the wafer surface in contact with the polishing surface or a portion of the carrier (e.g., a wafer holding surface) may be lowered, to position the wafer in contact with the polishing surface. After polishing is complete, one or more conditioners—e.g., conditioner 318, may be employed to condition the polishing surfaces.

Figure 5:
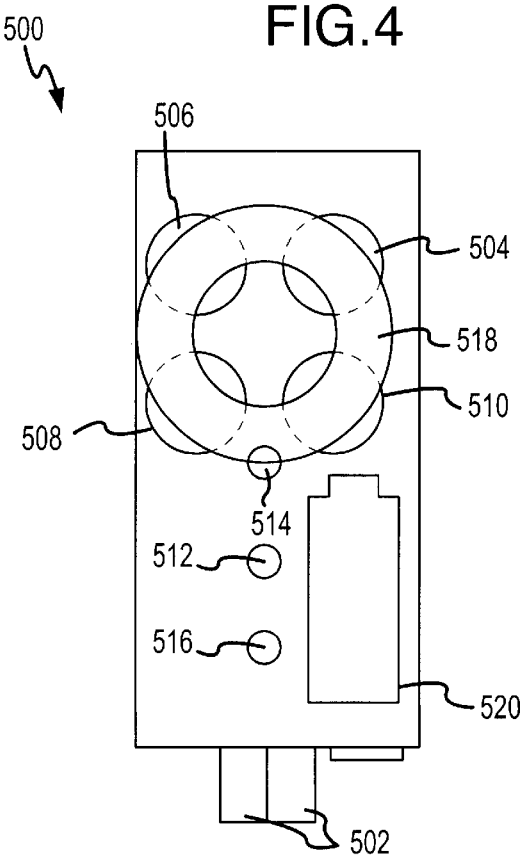
FIG. 5 illustrates a top cut-away view of a polishing system in accordance with yet another embodiment of the invention.

FIG. 5 illustrates another polishing system 500 in accordance with the present invention. System 500 is suitably configured to receive a wafer from a cassette 502 and return the wafer to the same or to a predetermined different location within a cassette in a clean, dry state.

System 500 includes polishing stations 504 and 506, a buff station 508, a head loading station 510, a transfer station 512, a wet robot 514, a dry robot 516, a rotatable index table 518, and a clean station 520.

Figure 6:
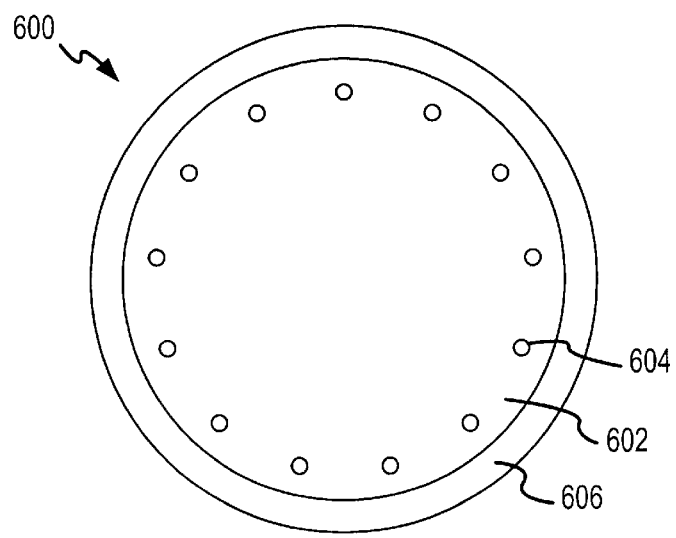
FIG. 6 illustrates a bottom view of a carrier for use with the system of FIG. 5.

During a polishing process, a wafer is held in place by a carrier 600, illustrate in FIG. 6. Carrier 600 includes a receiving plate 602, including one or more apertures 604, and a retaining ring 606. Apertures 604 are designed to assist retention of a wafer by carrier 600 by, for example, allowing a vacuum pressure to be applied to a back side of the wafer or by creating enough surface tension to retain the wafer. Retaining ring limits the movement of the wafer during the polishing process.

In operation, dry robot 516 unloads a wafer from a cassette 502 and places the wafer on transfer station 512. Wet robot 514 retrieves the wafer from station 512 and places the wafer on loading station 510. The wafer then travels to polishing stations 504–508 for polishing and returns to station 510 for unloading by robot 514 to station 512. The wafer is then transferred to clean system 520 to clean, rinse, and dry the wafer before the wafer is returned to load and unload station 502 using dry robot 516.

Figure 7:
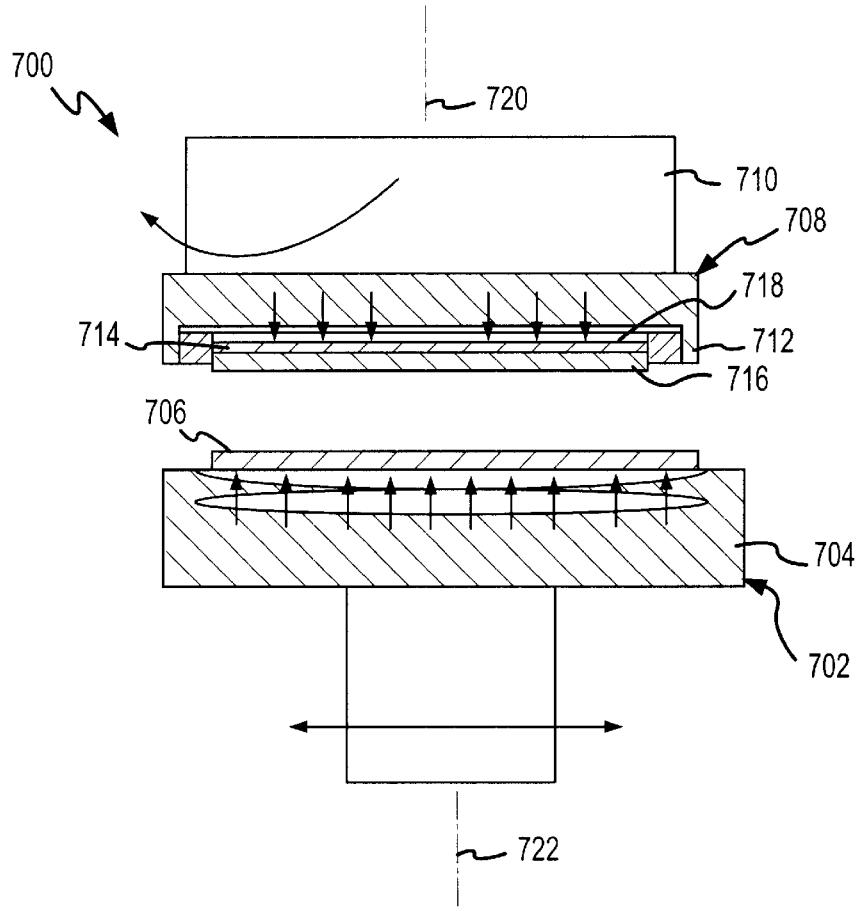
FIG. 7 illustrates a cross-sectional view of a polishing apparatus in accordance with one embodiment of the invention.
Figure 11:
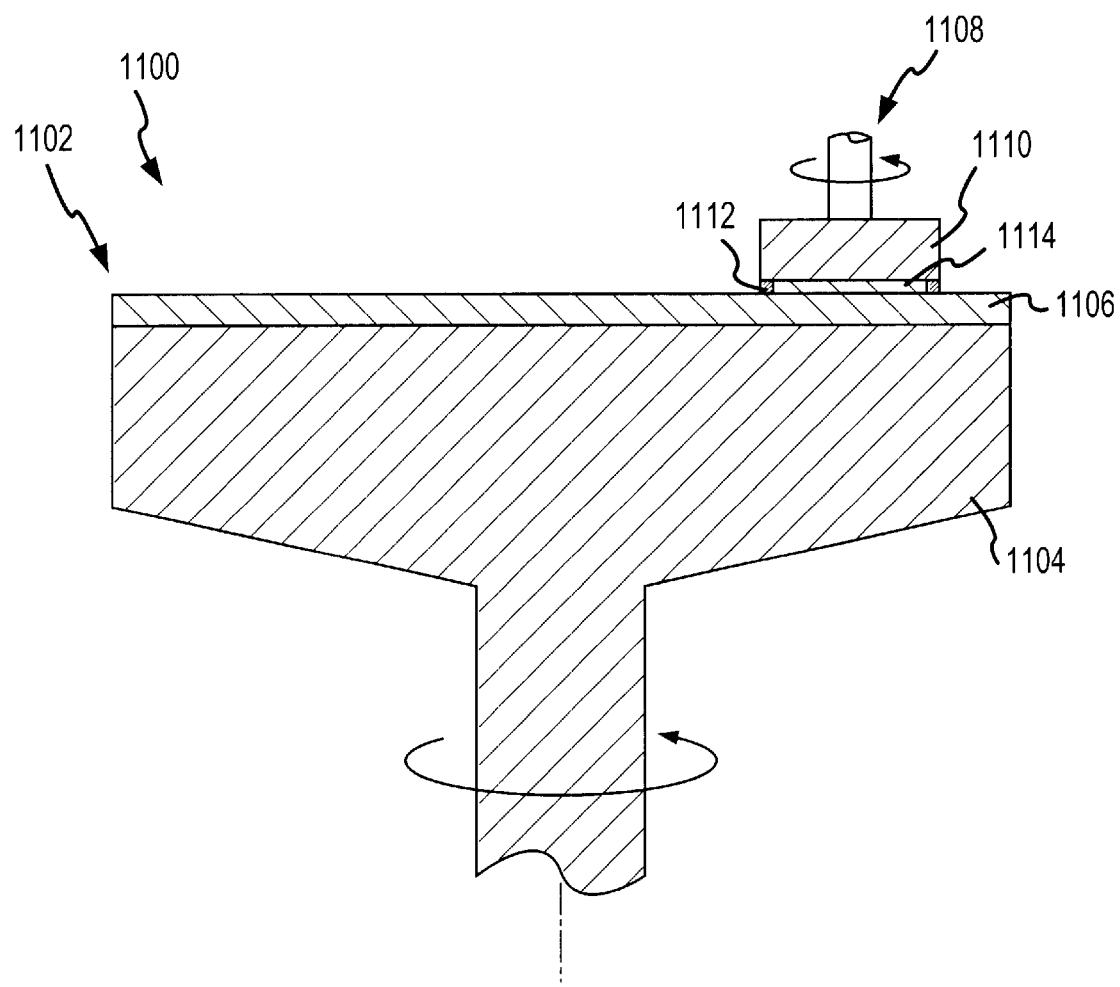
FIG. 11 illustrates a top cut-away view of a polishing apparatus in accordance with another embodiment of the invention.
Figure 12:
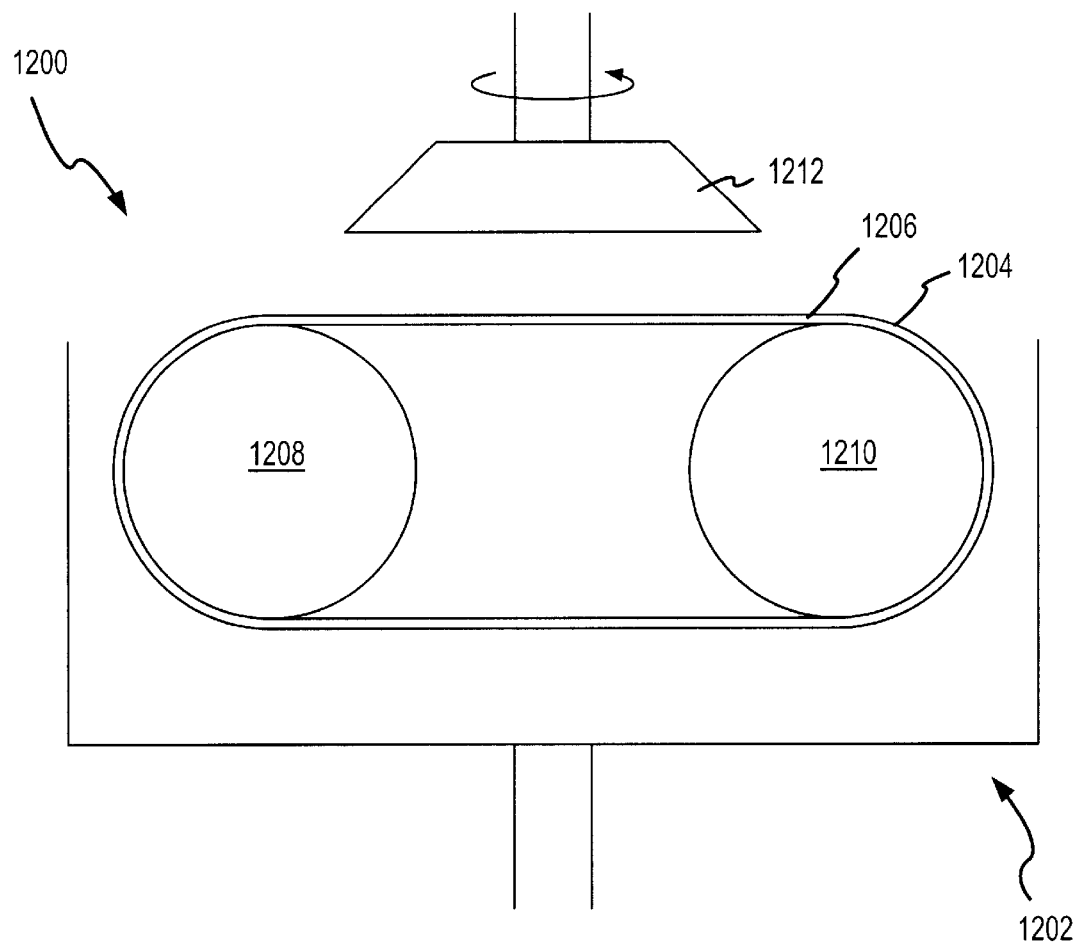
FIG. 12 illustrates a cross-sectional view of a polishing apparatus in accordance with yet another embodiment of the invention.

FIGS. 7, 11, and 12 illustrate apparatus suitable for polishing stations (e.g., polishing stations 108–114, 302–306, and 504–508) in accordance with the present invention. In accordance with various embodiments of the invention, systems such as apparatus 100, 300, and 500 may include one or more of the polishing apparatus described below, and if the system includes more than one polishing station, the system may include any combination of polishing apparatus, including at least one polishing apparatus described herein.

FIG. 7 illustrates a cross-sectional view of a polishing apparatus 700 suitable for polishing a surface of a wafer in accordance with an exemplary embodiment of the invention. Apparatus 700 includes a lower polish module 702, including a platen 704 and a polishing surface 706 and an upper polish module 708, including a body 710 and a retaining ring 712, which retains the wafer during polishing.

Upper polish module or carrier 708 is generally configured to receive a wafer for polishing and urge the wafer against the polishing surface during a polishing process. In accordance with one embodiment of the invention, carrier 708 is configured to receive a wafer, apply a vacuum force (e.g., about 55 to about 70 cm Hg at sea level) to the backside of wafer 716 to retain the wafer, move in the direction of the polishing surface to place the wafer in contact with polishing surface 706, release the vacuum, and apply a force (e.g., about 0 to about 8 psi.) in the direction of the polishing surface. In addition, carrier 708 is configured to cause the wafer to move. For example, carrier 708 may be configured to cause the wafer to move in a rotational, orbital, or translational direction. In accordance with one aspect of this embodiment, carrier 708 is configured to rotate at about 2 rpm to about 20 rpm about an axis 720.

Carrier 708 also includes a membrane 714 interposed between a wafer 716 and body 710 to provide a cushion for wafer 716 during a polishing process. Carrier 708 may also include an air bladder 718 configured to provide a desired, controllable pressure to a backside of the wafer during a polishing process. In this case, the bladder may be divided into zones such that various amounts of pressure may be independently applied to each zone. A carrier including multiple pressure zones, which is suitable for use in connection with the present invention, is disclosed in application Ser. No. 09/540,476, in the name of the assignee hereof, the content of which is hereby incorporated by reference.

Figure 13:
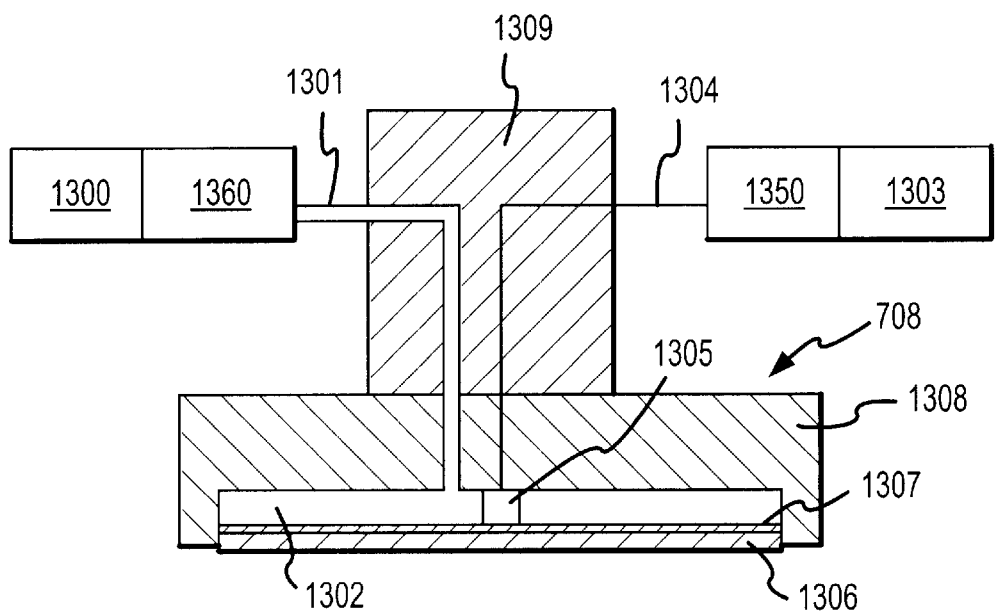
FIG. 13 illustrates a cross-sectional view of a single zone carrier with a sensor.

FIG. 13 illustrates another embodiment of a carrier 708. This embodiment of a carrier 708 is configured to detect the presence of a wafer 1306 in the carrier 708. The carrier 708 includes a body 1308 having a shallow recess or cavity 1302. The body 1308 provides structural support for the carrier 708 and is preferably made from a noncorrosive material. The body 1308 may also be connected to the rest of the tool, for example any of the tool embodiments described herein, via a shaft 1309 for pressing and possibly rotating the body 1308. In one particular embodiment, the shaft 1309 is connected to a carousel apparatus for transporting the carrier 708 from one station to another station within the tool.

Figure 21:
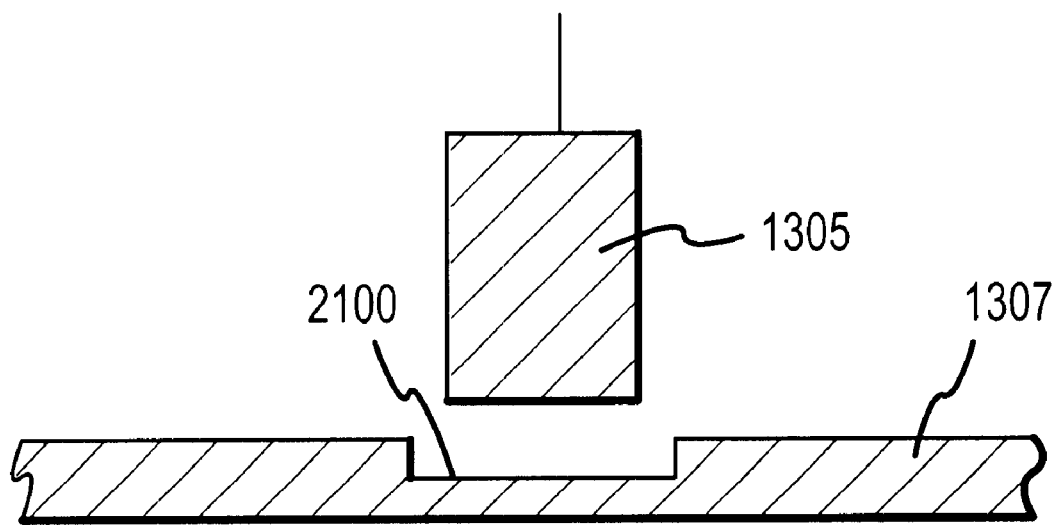
FIG. 21 illustrates a blown up cross-sectional view of a membrane with an optional notch.

A membrane 1307 may be positioned over the cavity 1302 to form an initial plenum 1302 between the body 1308 and the membrane 1307. The membrane 1307 is used to support the back surface of the wafer 1307 during the polishing process. The membrane 1307 is preferably a flexible resilient film of uniform thickness, but may have variations in thickness if desired. The membrane may comprise, for example rubber or another resilient flexible material. FIG. 21 illustrates one embodiment of a portion of a membrane 1307 having a notch 2100 for receiving a portion of a sensor 1305. The notch 2100 allows the sensor 1305 to be moved closer to the wafer and may improve the detection capability of the sensor 1305. In this embodiment, the membrane is preferably about 0.08 inches with the notch removing about 0.04 inches from the membrane.

Referring back to FIG. 13, a sensor 1305 may be positioned within the initial plenum 1302 for detecting the presence of the wafer 1306. The sensor 1305 may be, for example, an inductive, ultrasonic, optical, or mechanical sensor, but is preferably a capacitive sensor mounted to the body 1308 of the carrier 708.

Capacitive sensors have the ability to "see through" lower dielectric materials to detect higher dielectric materials. For examples, a capacitive sensor may detect a silicon wafers through a membrane, a membrane through an air gap or a membrane adjacent the sensor. The size of a capacitive sensor positioned within the plenum 1302 may be reduced by positioning the sensor's amplifier 1350 outside of the plenum 1302. The sensor 1305 is preferably connected to a control system 1303 that may act upon the information acquired from the sensor 1305. A remote sensor amplifier 1350 also improves the access to the amplifier 1350 during calibration procedures. The gain of the amplifier 1350 is adjusted during calibration until the sensor 1305 can easily distinguish between the conditions of when the wafer is not properly retained and when the wafer is properly retained. The communication path 1304 between the sensor 1305 and the control system 1303 may use, for example, electrical wire, fiber optics or radio technology.

Figure 14:
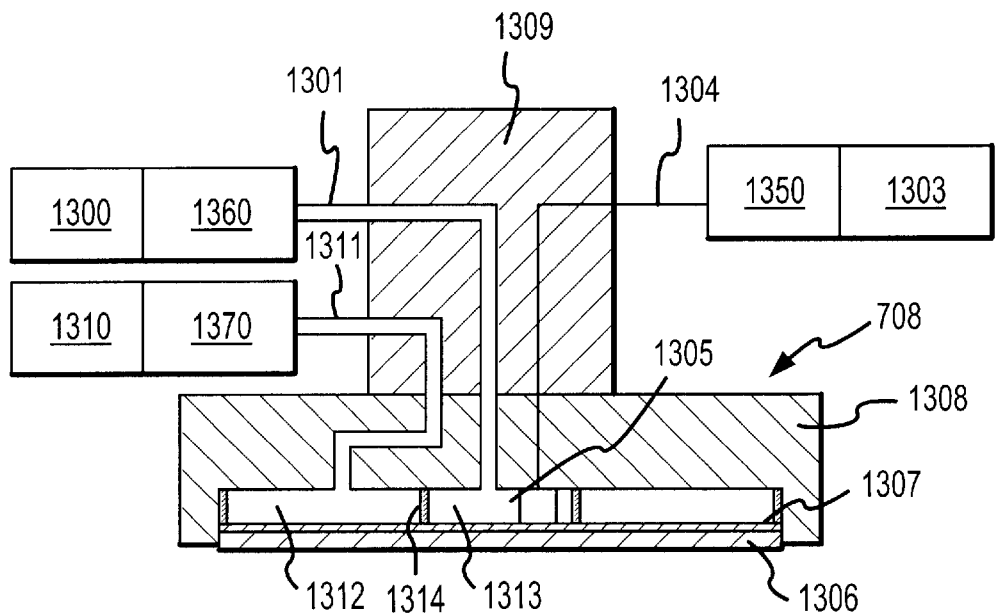
FIG. 14 illustrates a cross-sectional view of a dual or multizone carrier with a sensor.
Figure 19:
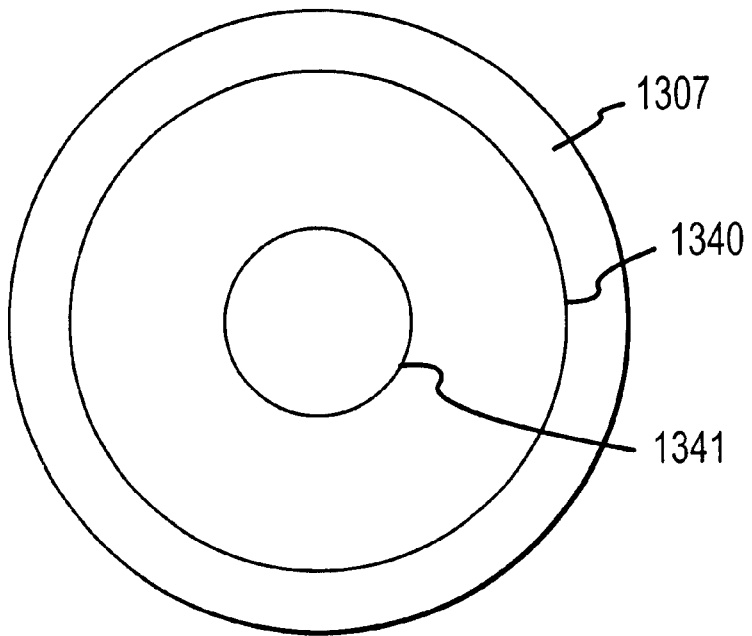
FIG. 19 illustrates a plan view of a membrane and two annular ribs used in a multizone carrier.
Figure 20:
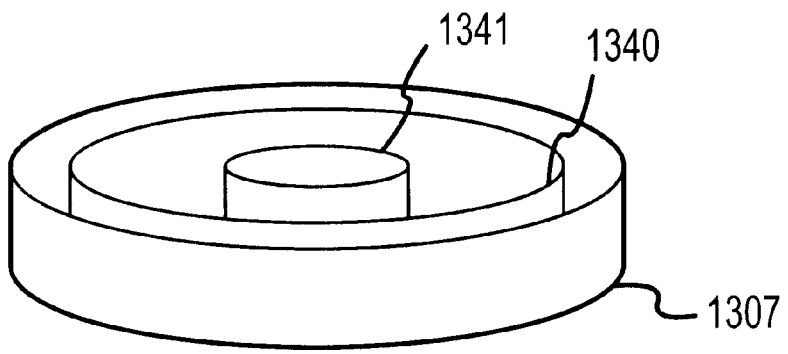
FIG. 20 illustrates a perspective view of a membrane and two annular ribs used in a multizone carrier.

FIG. 14 illustrates the use of a single divider, preferably an annular rib 1314, that may extend from the body 1308 to the membrane 1307 to divide the initial plenum into a first plenum 1312 and a second plenum 1313. Dividers or annular ribs allow a carrier to have a plurality of zones that may be used to apply different urging forces on different areas of the back surface of the wafer. FIGS. 19 and 20 illustrate a membrane 1307 with two annular ribs 1341 and 1340 that may be used to form three zones or plenums. Any number, size and positioning of plenums may be created by moving and/or adding additional ribs.

Figure 15:
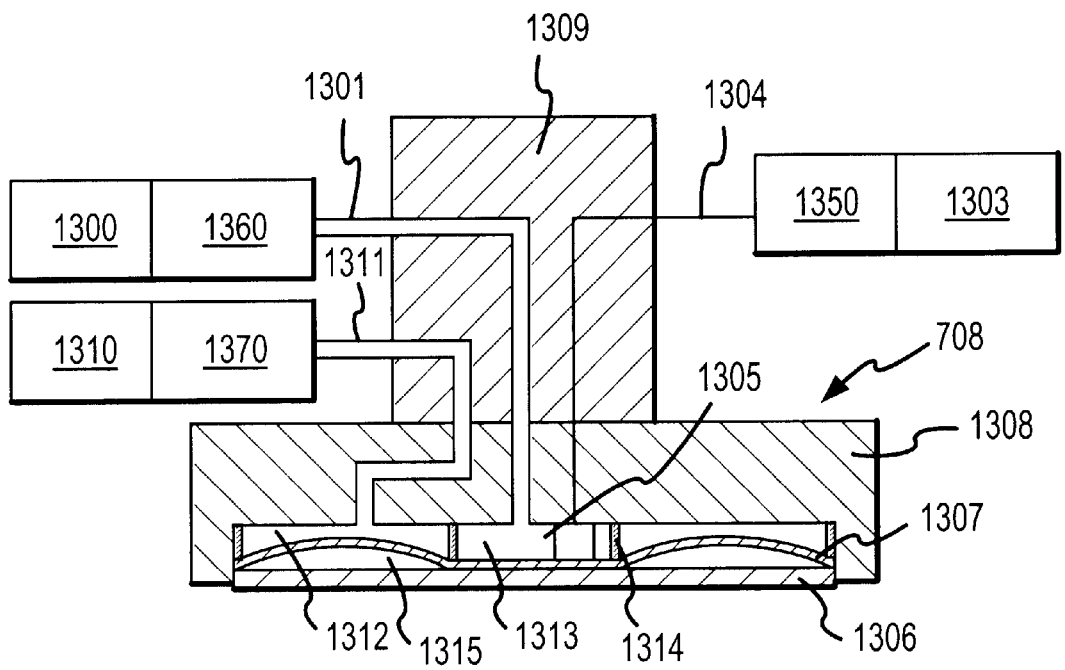
FIG. 15 illustrates a cross-sectional view of a dual or multizone carrier retaining a wafer.
Figure 16:
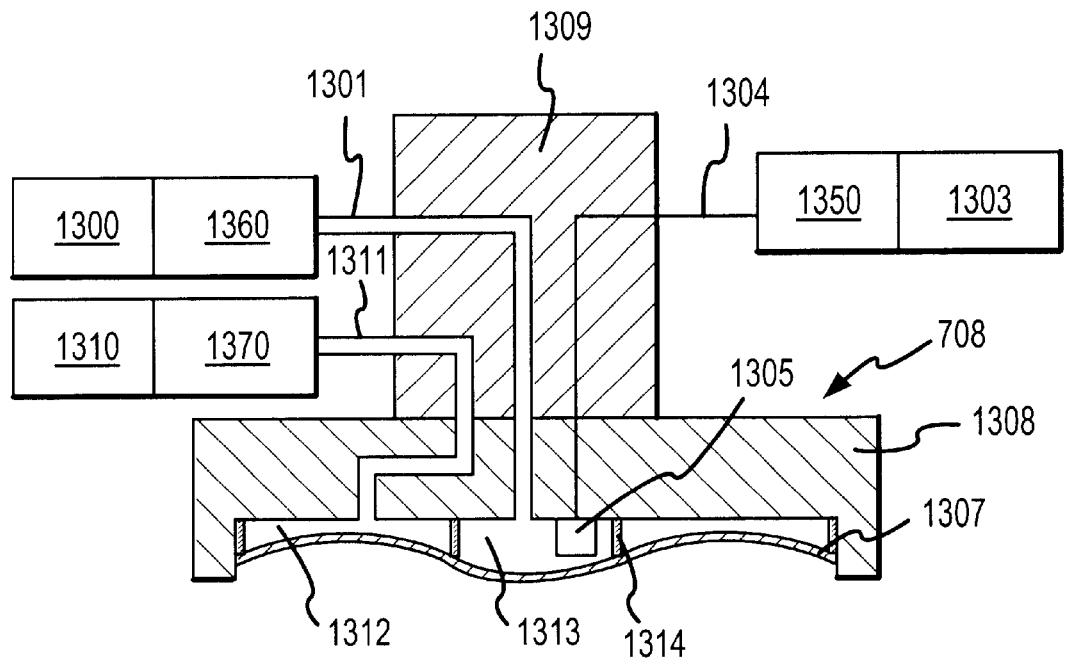
FIG. 16 illustrates a cross-sectional view of a dual or multizone carrier that is not retaining a wafer.
Figure 17:
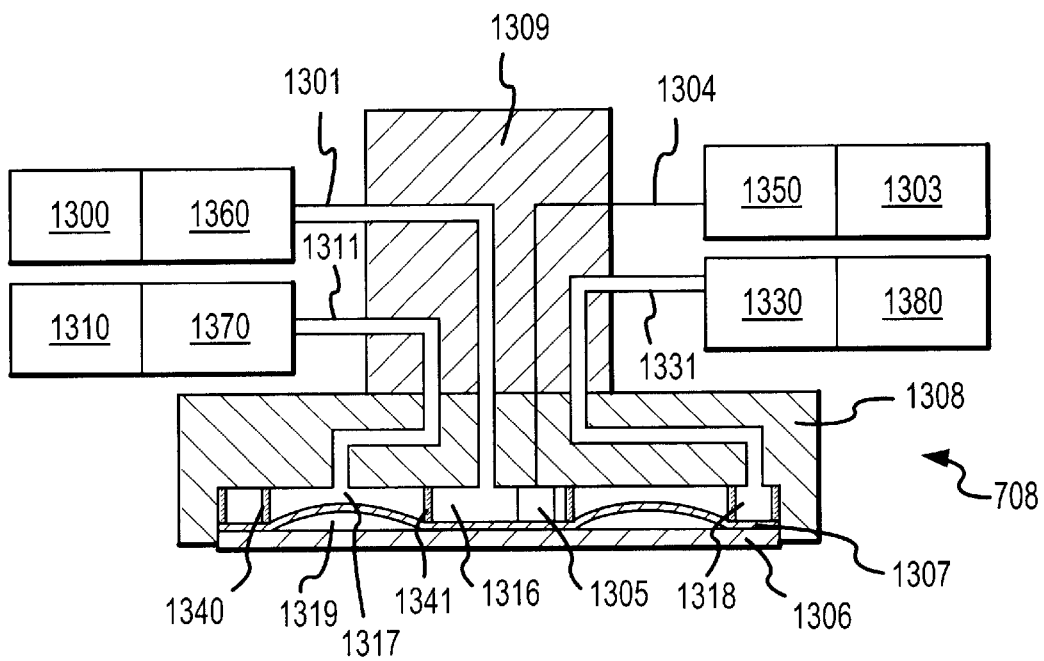
FIG. 17 illustrates a cross-sectional view of a triple or multizone carrier that is retaining a wafer.
Figure 18:
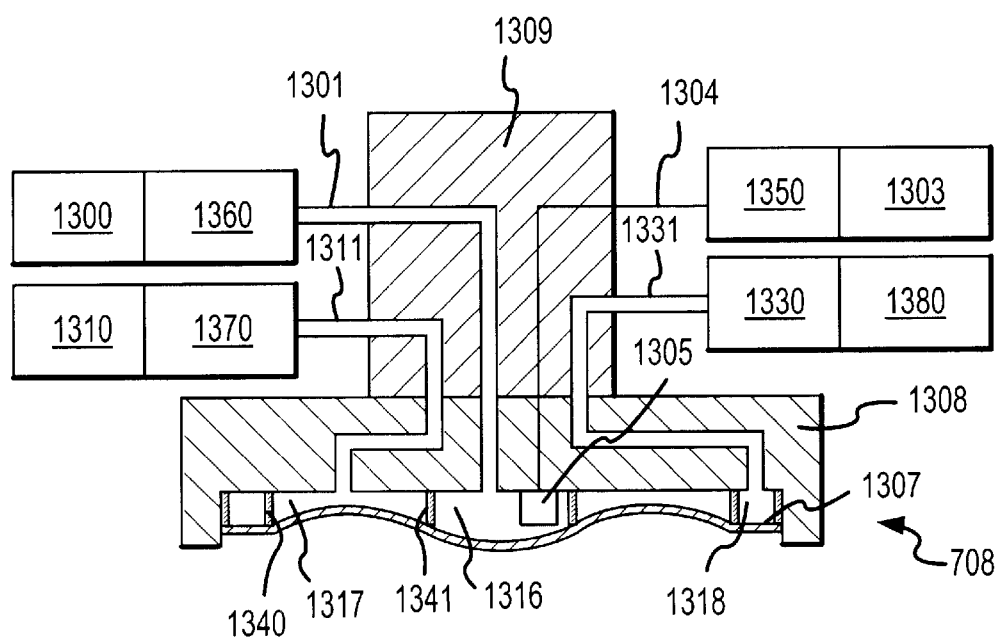
FIG. 18 illustrates a cross-sectional view of a triple or multizone carrier that is not retaining a wafer.

FIGS. 13–18 show various combinations of pumps 1300, 1310 and 1380 having a pressure regulator 1330, 1360 and 1370 to pressurize an initial plenum 1302 or plurality of plenums 1312 and 1313 or 1316–1318 in a carrier 708. Pathways 1301, 1311 and 1331 allow vacuum or pressurized air to be communicated to the plenums in the carrier 708 during a wafer detection process or the polishing process. The pathways may include a rotary union (not shown) in the shaft 1309. The number and connections between the pump(s), pressure regulator(s) and pathways to the plenum(s) may be configured in a variety of ways as is known in the art, but they are preferably configured so that the pressure within each plenum is independently controllable. FIG. 13 illustrates a single plenum setup, FIGS. 14–16 illustrate a double plenum setup, and FIGS. 17, 18 illustrate a triple plenum setup.

Figure 22:
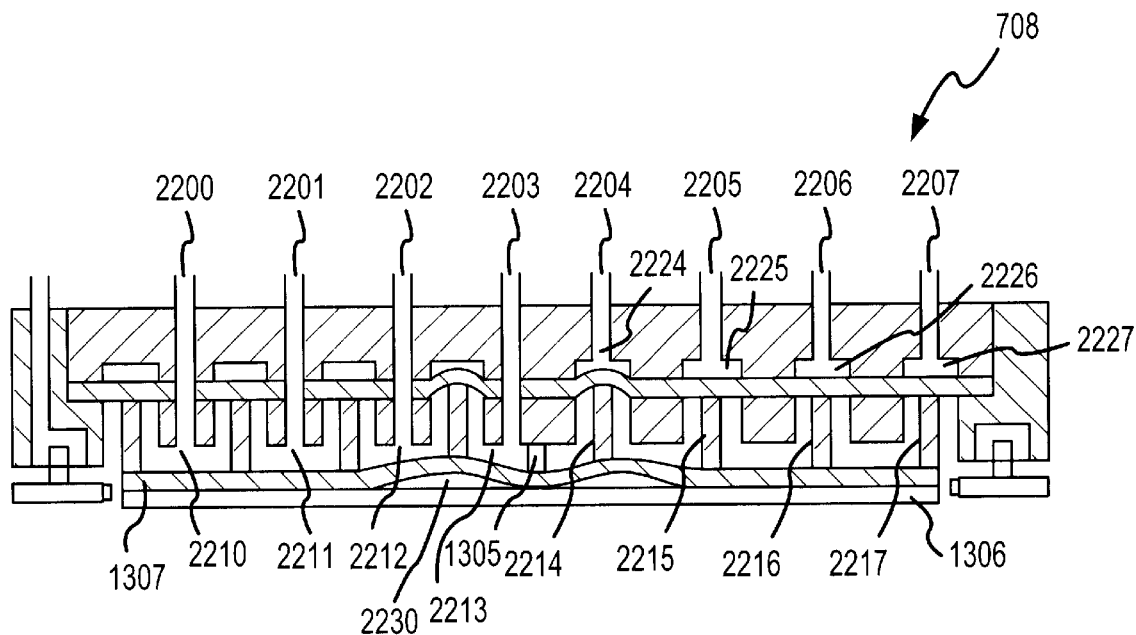
FIG. 22 illustrates a cross-sectional view of a multizone carrier utilizing ribs with a wafer properly retained.
Figure 23:
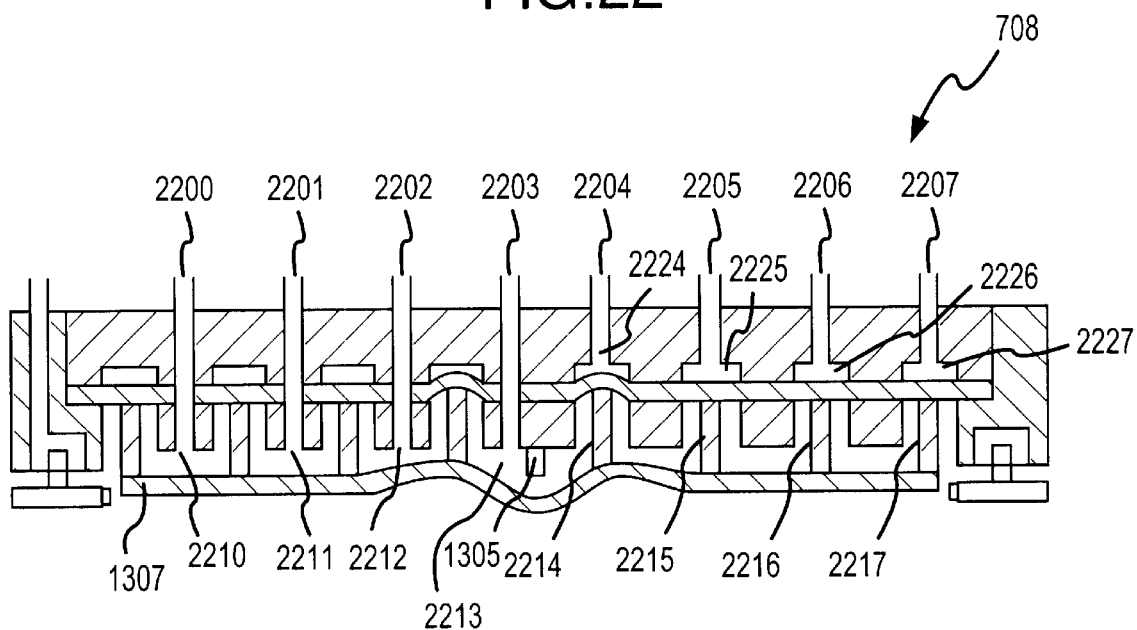
FIG. 23 illustrates a cross-section view of a multizone carrier utilizing ribs without a properly retained wafer.
Figure 24:
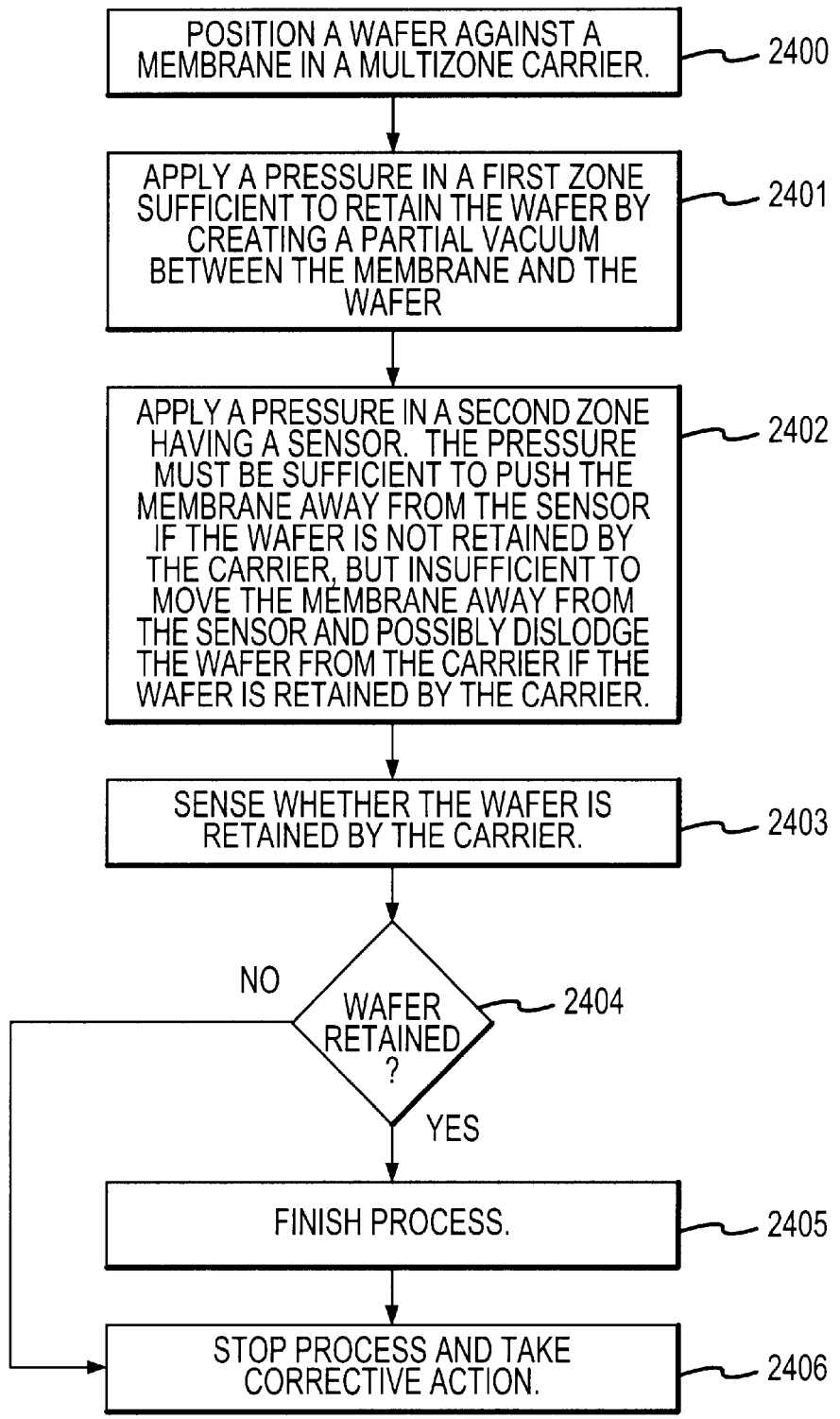
FIG. 24 is a flow chart of one possible method of practicing the invention.

In certain carrier embodiments, the ribs may also be used to exert individually controllable urging forces on the back surface of the wafer. Multizone carriers having controllable ribs greatly improve the flexibility and control of the polishing process. FIGS. 22, 23 illustrate a carrier 708 having eight plenums; four plenums 2210, 2211, 2212, and 2213 that control an urging force directly on the membrane 1307 and four plenums 2224, 2225, 2226, and 2227 that control an urging force on four corresponding ribs 2214, 2215, 2216, and 2217. Eight pathways 2200–2207 may be used to individually control the eight corresponding plenums 2210–2213 and 2224–2227. Additional plenums may be added for additional process flexibility, but additional plenums also increase the cost and complexity of the carrier.

A first method for detecting if a wafer 1306 is properly loaded in a carrier 708 may be accomplished by the carrier 708 as illustrated in FIG. 13. A robotic end effector or other means may be used to position a back surface of a wafer 1306 against a membrane 1307 of the carrier 708 and sensing, preferably via a capacitive sensor positioned on the other side of the membrane, whether the wafer 1306 is present. One or more apertures (not shown) in the membrane 1307 may have to be used to affirmatively grip the wafer 1306 through the application of a vacuum to the back surface of the wafer 1306 if the carrier 708 lifts or moves the wafer 1306.

Another method for detecting if a wafer 1306 is properly loaded in a carrier will be discussed with continuing reference to FIGS. 15–18 and 24. This method requires a multizone carrier 708, but has the advantage of also allowing the carrier 708 to grip the wafer 1306 without an aperture in the membrane 1307. The affirmative gripping of the wafer 1306 allows the carrier 708 to retain the wafer 1306 while the wafer 1306 is transported within the tool. A robotic end effector or other means may be used to position a back surface of a wafer 1306 against a membrane 1307 of the carrier 708. (Step 2400)

A first pressure may be generated by a pump 1310 and may be controlled by a pressure regulator 1370 and communicated to a first plenum in a carrier 708. The first pressure is preferably sufficient to pull the membrane 1307 away from the back surface of the wafer 1306 beneath the first plenum thereby creating a partial vacuum or void between the wafer 1306 and the membrane 1307. The first pressure may be, for example, about −10 psi. The void creates a suction that holds the wafer 1306 in the carrier 708. (Step 2401) FIG. 15 illustrates a two plenum carrier 708 with a first plenum 1312 and a void 1315. FIG. 17 illustrates a three plenum carrier 708 with a first plenum 1317 and a void 1319. Additional plenums may also be used in this manner to create additional suction of the wafer 1306 to the carrier 708.

A sensor 1305 may be used to detect whether the wafer 1306 is properly held by the carrier 708 by detecting the presence of the wafer 1306 through the membrane 1307. A capacitive sensor, for example, may be used to detect the presence of the wafer 1306 (a higher dielectric) through the membrane 1307 (a lower dielectric).

However, a more reliable method of detecting the presence of the wafer 1306 involves applying a second pressure, which may be generated by a pump 1300, controlled by a pressure regulator 1360 and communicated via a pathway 1301 to a second plenum in a carrier 708. The second plenum should be the plenum within which the sensor 1305 is located. The second plenum may be, for example, plenum 1313 in FIGS. 15 and 16 or plenum 1316 in FIGS. 17 and 18. The second pressure is preferably sufficient to urge the membrane 1307 away from the sensor 1305 if the wafer 1306 is not retained in the carrier 708, as shown in FIGS. 16 and 18, and insufficient to urge the membrane 1307 away from the sensor 1305 if the wafer 1306 is retained in the carrier 708. The second pressure may be, for example, about 0.2 psi. (Step 2402)

The pressure within the first and second plenums are preferably optimized depending on, for example, the size and location of the plenums, the flexibility of the membrane, the weight of the wafer 1306, and the speed of movement of the carrier 708. The example pressures of −10 psi in the first plenum and 0.2 psi in the second plenum will not work for every carrier and some empirical testing should be done to find the best pressures for the particular carrier being used.

If the membrane 1307 is touching or near the sensor 1305, the wafer 1306 is properly retained and the polishing process may continue. (Step 2405) This condition is illustrated in FIGS. 15 and 17. However, if the membrane 1307 has been urged away from the sensor 1305 in the second plenum, the wafer 1306 is not properly retained and the polishing process may be terminated. (Step 2406) This condition is illustrated in FIGS. 16 and 18.

Mechanical, inductive, ultrasonic, optical, or capacitive sensors may be used as the sensor 1305. The signal from the sensor 1305 may be communicated to a control system 1303, possibly through an amplifier 1350. In this manner it may be determined if the wafer 1306 is properly held by the carrier 708 and appropriate steps taken. (Steps 2403 and 2404)

Another method for detecting if a wafer 1306 is properly loaded in a carrier 708 will be discussed with continuing reference to FIGS. 22 and 23. This method requires a multizone carrier 708 having one or more ribs that may also be individually controlled or manipulated. Ribs 2214–2217 may be urged downward or sucked upward depending on the pressure within corresponding plenums 2224–2227. Plenums 2224–2227 may be pressurized via corresponding passageways 2204–2207 by corresponding pressure regulators and pump(s) (not shown in FIGS. 22 or 23). A robotic end effector or other means may be used to position a back surface of a wafer 1306 against a membrane 1307 of the carrier 708.

A first pressure may be generated by a pump (not shown in FIGS. 22 or 23) and may be controlled by a pressure regulator and communicated to a first plenum 2224 in carrier 708. The first pressure is preferably sufficient to suck the rib 2214 and attached membrane 1307 away from the back surface of the wafer 1306 beneath the first plenum 2224 and rib 2214 thereby creating a partial vacuum or void 2230 between the wafer 1306 and the membrane 1307. The first pressure may be, for example, about −10 psi. The void 2230 creates a suction that holds the wafer 1306 in the carrier 708. Additional plenums may also be used in this manner to create additional suction of the wafer 1306 to the carrier 708.

A sensor 1305 may be used to detect whether the wafer 1306 is properly held by the carrier 708 by detecting the presence of the wafer 1306 through the membrane 1307. A capacitive sensor, for example, may be used to detect the presence of the wafer 1306 (a higher dielectric) through the membrane 1307 (a lower dielectric).

However, a preferred method of detecting the presence of the wafer 1306 involves applying a second pressure, which may be generated by a pump, controlled by a pressure regulator and communicated via a pathway 2203 to a second plenum 2213 in a carrier 708. The second plenum should be the plenum within which the sensor 1305 is located. The second pressure is preferably sufficient to urge the membrane 1307 away from the sensor 1305 if the wafer 1306 is not retained in the carrier 708, as shown in FIG. 23, and insufficient to urge the membrane 1307 away from the sensor 1305 if the wafer 1306 is retained in the carrier 708 as shown in FIG. 22. The second pressure may be, for example, about 0.2 psi.

Carriers having various numbers and sizes of plenums may also be used in a similar manner as described to retain and detect the presence of a wafer. After it has been determined that the wafer 1306 has been properly loaded in the carrier 708, the carrier 708 may transport, possible in combination with a carousel apparatus or other mechanical means, the wafer 1306 to a polishing surface. The pressure in the various plenums of the carrier 708 may now be adjusted from a retaining and detecting pressure to a polishing pressure to properly polish the wafer 1306 against the polishing surface.

If desired, the presence of the wafer may be verified even during the polishing process to verify that the wafer does not become dislodged from the carrier during the polishing process. After the polishing process has been completed, the carrier may reapply the retaining and detecting pressures as previously described to once again affirmatively grip the wafer to transport the wafer away from the polishing surface and, if desired, the carrier may detect for the presence of the wafer to verify that the wafer was not lost during the polishing process or during the moving of the wafer away from the polishing surface.

Lower polishing module 702 is generally configured to cause the polishing surface to move. By way of example, lower module 702 may be configured to cause the polishing surface to rotate, translate, orbit, or any combination thereof. In accordance with one embodiment of the invention, lower module 702 is configured such that platen 704 orbits with a radius of about 0.25 to about 1 inch, about an axis 722 at about 30 to about 3000 orbits per minute, while simultaneously causing the platen 704 to dither or partially rotate. In this case, material is removed primarily from the orbital motion of module 704. Causing the polishing surface to move in an orbital direction is advantageous because it allows a relatively constant speed between the wafer surface and the polishing surface to be maintained during a polishing process. Thus, material removal rates are relatively constant across the wafer surface.

Polishing apparatus including orbiting lower modules 702 are additionally advantageous because they require relatively little space compared to rotational polishing modules described below. In particular, because a relatively constant velocity between the wafer surface and the polishing surface can be maintained across the wafer surface by moving the polishing surface in an orbital motion, the polishing surface can be about the same size as the surface to be polished. For example, a diameter of the polishing surface may be about 0.5 inches greater than the diameter of the wafer.

Figure 8:
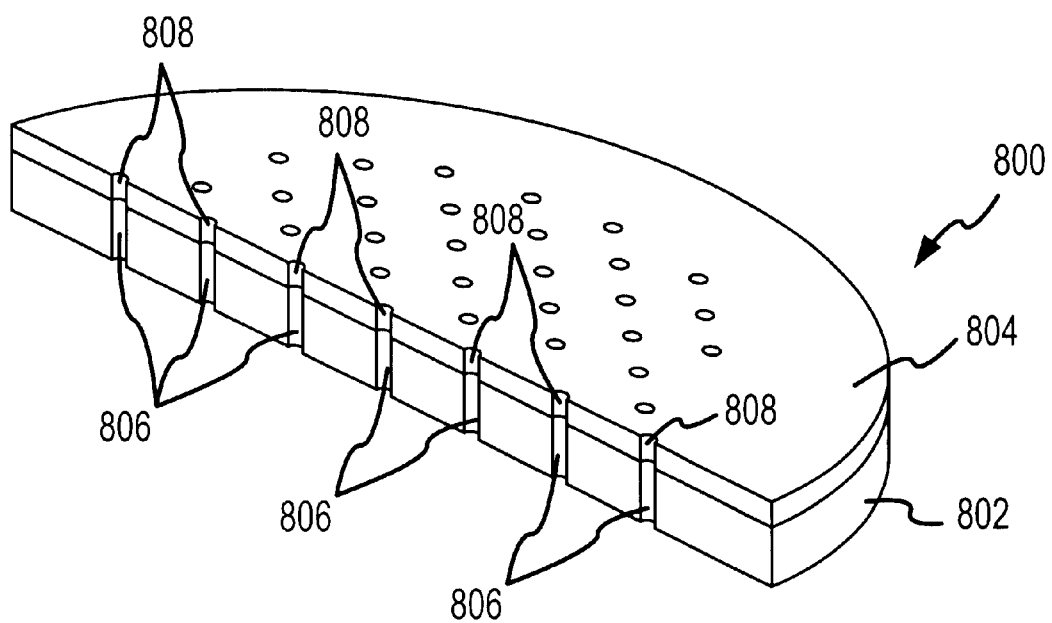
FIG. 8 illustrates a portion of the polishing apparatus of FIG. 7 in greater detail.

FIG. 8 illustrates a portion of a lower polishing module 800, including a platen 802 and a polishing surface 804, suitable for use with polishing apparatus 700. Platen 802 and polishing surface 804 include channels 806 and 808 formed therein to allow polishing fluid such as slurry to flow through platen 802 and surface 804 toward a surface of the wafer during the polishing process. Flowing slurry toward the surface of the wafer during the polishing process is advantageous because the slurry acts as a lubricant and thus reduces friction between the wafer surface and polishing surface 804. In addition, providing slurry through the platen and toward the wafer facilitates uniform distribution of the slurry across the surface of the wafer, which in turn facilitates uniform material removal from the wafer surface. The slurry distribution through the polishing surface 804 forces the removed material outwards from the polishing surface 804. The slurry flow rates may be selected for a particular application; however, in accordance with one embodiment of the invention, the slurry flow rates are less than about 200 ml/minute and preferably about 120 ml/minute.

Figure 9A:
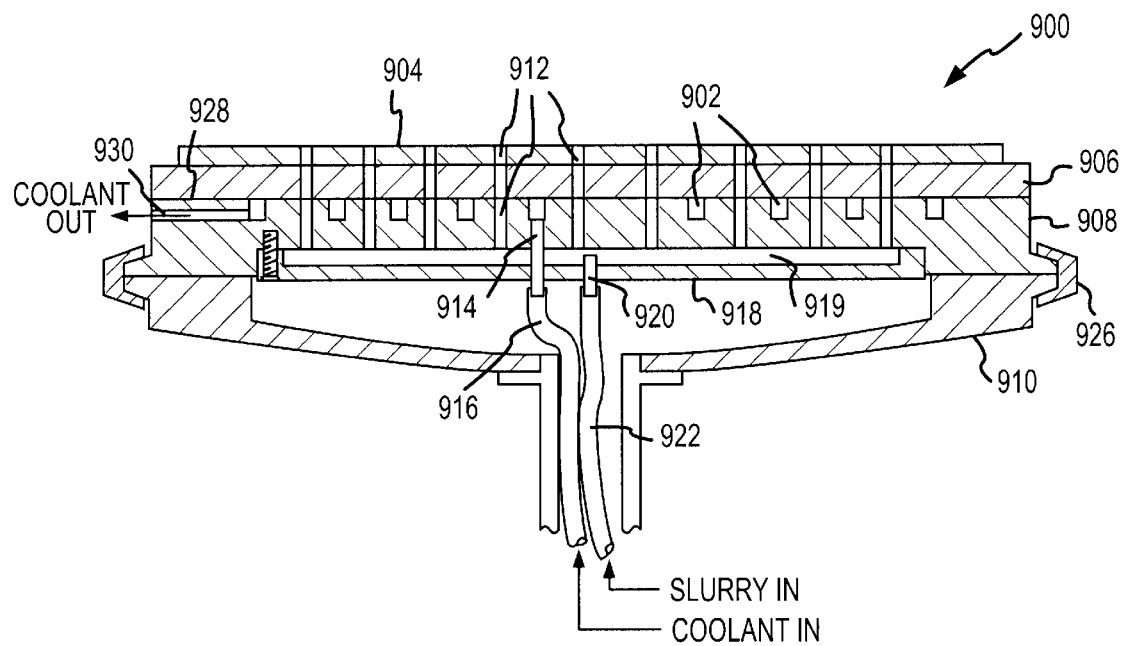
FIGS. 9A and 9B illustrate a platen including heat exchange channels in accordance with the present invention.
Figure 9B:
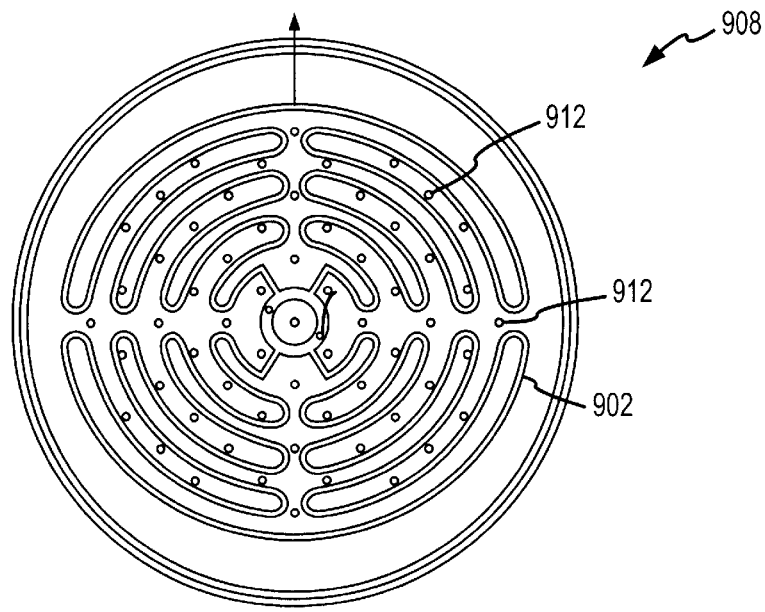

FIGS. 9A and 9B illustrate a portion of a lower polish module 900 in accordance with yet another embodiment of the invention. Structure or polish head 900 includes a fluid channel 902 to allow heat exchange fluid such as ethylene glycol and/or water to flow therethrough to cool or heat a surface of a polishing surface 904 such as a polishing pad. Module 900 is suitably formed of material having a high thermal conduction coefficient to facilitate control of the processing temperature.

Lower polish head 900 includes a top plate 906, a channel plate 908, and a base plate or bell housing 910, which are coupled together to form polish head 900. Top plate 906 includes a substantially planar top surface to which a polishing surface 904 such as a polishing pad is attached—e.g., using a suitable adhesive. Channel section 908 includes channel 902 to allow heat exchange fluid to flow through a portion of polish head 900. Bottom section 910 is configured for attachment of the polish head to a platen shaft. To allow slurry circulation through polish head 900, cover plate 906, channel section 908, and bottom plate 910 each include channels 912 similar to channels 806 and 808, illustrated in FIG. 8, through which a polishing solution may flow. In accordance with one exemplary embodiment of the invention, top plate 908 is brazed to channel section 908 and the combination of top plate 906 and channel plate 908 is coupled to lower plate 910 using clamp ring 926, or alternatively another suitable attachment mechanism such as bolts.

Heat exchange fluid is delivered to polish head 900 through a fluid delivery conduit 914 and a flexible fluid delivery tube 916. Fluid circulates through channel 902 and exits at outlet 930.

Slurry is distributed to polish head 900 using a flexible slurry delivery tube 922 and a slurry delivery conduit 920 to deliver the slurry to a slurry chamber 919. Slurry is then distributed to a top surface of polish head 900 using conduits 912. In accordance with one aspect of this embodiment, slurry chamber 919 is formed by securing a slurry manifold cover 918 to a lower surface of channel section 908.

In an alternative embodiment, the channel groove is formed in the underside of the cover plate. The channel groove may be sealed by attaching a circular disk having a planar top surface to the underside of the cover plate. The bottom section is attached to the circular disk, or, alternatively, the junction of the circular disk and the bottom section could be combined. In either this case or the illustrated case, a channel groove through which a heat exchange fluid can be circulated is formed beneath the substantially planar surface of the platen assembly.

In accordance with yet another embodiment of the invention, the temperature of the polishing process may be controlled by providing a heat exchange fluid to the backside of a wafer. Apparatus for exposing a heat exchange fluid to the backside of a wafer are well known in the art. For an example of an apparatus configured to regulate the polishing rate of a wafer by backside heat exchange, see U.S. Pat. No. 5,605,488, issued to Ohashi et al. on Feb. 25, 1997, which patent is hereby incorporated by reference.

Figure 10:
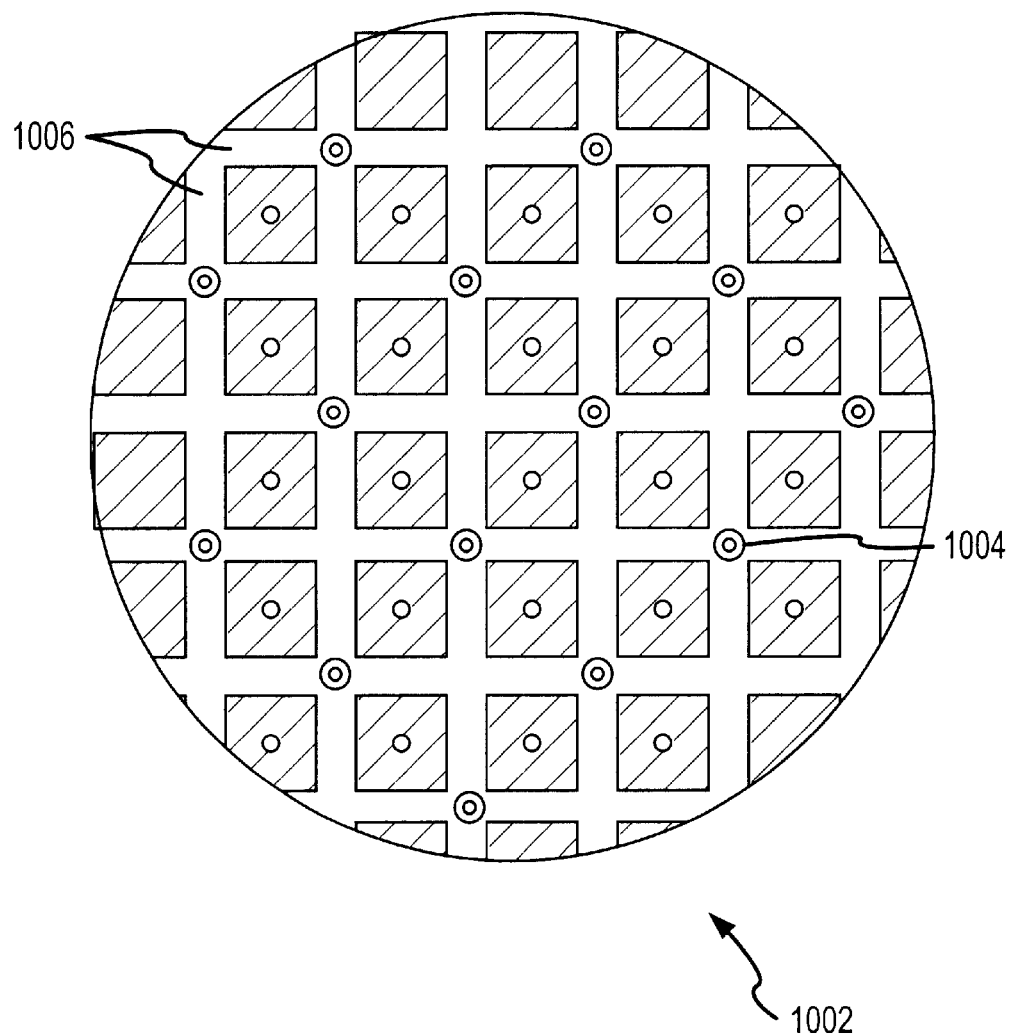
FIG. 10 illustrates a top plan view of a polishing surface, having grooves and apertures, in accordance with the present invention.

FIG. 10 illustrates a top view of polishing surface 1002 in accordance with the present invention. Polishing surface 1002 includes apertures 1004 extending through surface 1002. Apertures 1004 are suitably aligned with channels formed within a platen (e.g., platen 802), such that polishing solution may circulate through the platen and polishing surface 1002 as described above in connection with FIGS. 8, 9A, and 9B. Surface 1000 also includes grooves 1006. Grooves 1006 are configured to effect transportation of the polishing solution on polishing surface 1002 during a polishing process. Polishing surface 1002 may also be porous, further facilitating transportation of the polishing solution. It will be appreciated that polishing surface 1002 may have any suitably-shaped openings that are configured to produce a uniform or other desired slurry distribution across the surface. For example, grooves 1006 may be configured to facilitate a hydroplaning action such that a wafer floats on polishing solution during a polishing process. In accordance with one exemplary embodiment of the invention, surface 1002 is formed of polyurethane, having a thickness of about 0.050 to about 0.080 inches, and grooves 1006 are formed using a gang saw, such that the grooves are about 0.015 to about 0.045 inches deep, with a pitch of about 0.2 inches and a width of about 0.015 to about 0.030 inches.

FIG. 11 illustrates a cross-sectional view of a polishing apparatus 1100 suitable for polishing a surface of a wafer in accordance with another exemplary embodiment of the invention. Apparatus 1100 includes a lower polish module 1102, including a platen 1104 and a polishing surface 1106 and an upper polish module 1108, including a body 1110 and a retaining ring 1112, which retains the wafer during polishing. Apparatus 1100 may also include a slurry distribution apparatus to supply a polishing fluid to a top surface of lower module 1102.

Upper module 1108 is configured to cause the wafer to rotate, orbit, translate, or a combination thereof and to retain the wafer. In addition, upper module 1108 is configured to apply a pressure to wafer 1114 in the direction of lower module 1102, as discussed above in reference to upper module 708. Lower module is generally configured to move a polishing surface by rotating platen 1104 about its axis.

Although apparatus 1100 may be used to polish wafers in accordance with the present invention, apparatus 1100 generally requires additional space compared to apparatus 700. In particular, the diameter of polishing surface 1106 is generally a little larger than about twice the diameter of wafer 1114, whereas polishing surface 706 of lower module 702 is about the same size as the wafer. Additionally, because lower platen 1100 rotates about an axis, delivery of a polishing solution through platen 1104 may be problematic. Thus, several of the advantages associated with through-platen slurry delivery may be difficult to achieve using a rotational platen system, as illustrated in FIG. 11.

In operation, a wafer 1114 surface is polished by moving wafer 1114 using upper module 1108, while simultaneously rotating lower polishing module 1102 and polishing surface 1106 attached thereto. In accordance with one exemplary embodiment of the invention, upper module moves wafer 1114 in both a rotational and a translational direction during the polishing process. In accordance with another embodiment, upper module 1108 orbits about an axis.

FIG. 12 illustrates a linear polishing apparatus 1200, suitable for use in a polishing station, in accordance with another embodiment of the invention. Apparatus 1200 includes a lower polishing module 1202, including a polishing surface 1204 attached to a belt 1206, and rollers 1208 and 1210 and an upper module 1212, which may be the same as upper module 708 or 1108.

To effect polishing, carrier 1212 and/or polishing surface 1204 move relative to each other. For example, polishing may be effected primarily by moving surface 1204 relative to the wafer surface while rotating the wafer about the carrier axis. A linear polishing apparatus suitable for use in connection with the present invention is described in European Patent Application No. EP 0 916 452 A2, published on May 19, 1999, the content of which is hereby incorporated by reference.

Although the present invention is set forth herein in the context of the appended drawing figures, it should be appreciated that the invention is not limited to the specific form shown. Various other modifications, variations, and enhancements in the design and arrangement of the chemical mechanical polishing methods and apparatus as set forth herein may be made without departing from the spirit and scope of the present invention as set forth in the appended claims.

What is claimed is:

1. A carrier for planarizing a front surface of a wafer comprising:
    a) a body having a cavity;
    b) a membrane covering the cavity thereby forming a plenum; and
    c) a capacitive sensor positioned within the plenum.
2. The carrier of claim 1 wherein the capacitive sensor is mounted to the body.
3. The carrier of claim 1 wherein the membrane has a notch for receiving a portion of the capacitive sensor.
4. The carrier of claim 1 further comprising:
    d) a pump; and
    e) a pathway from the pump to the plenum.
5. The carrier of claim 1 further comprising:
    d) a remote amplifier in communication with the capacitive sensor; and
    e) a control system in communication with the remote amplifier.
6. A multizone carrier for planarizing a front surface of a wafer comprising:
    a) a body having a first cavity;
    b) at least one annular rib extending from the body thereby dividing the first cavity into a plurality of cavities;
    c) a membrane covering the plurality of cavities thereby forming a plurality of plenums; and
    d) a sensor positioned in one of the plurality of plenums.
7. The carrier of claim 6 wherein the sensor comprises a capacitive sensor.
8. The carrier of claim 6 wherein the sensor is mounted to the body.
9. The carrier of claim 6 wherein the membrane has a notch for receiving a portion of the sensor.
10. The carrier of claim 6 further comprising:
    e) a pump; and
    f) a pathways from the pump to one of the plurality of plenums.
11. The carrier of claim 6 further comprising:
    e) a remote amplifier in communication with the sensor; and
    f) a control system in communication with the remote amplifier.
12. An apparatus for planarizing a front surface of a wafer comprising:
    a) a body having a cavity;
    b) a membrane, for supporting a wafer, covering the cavity thereby forming an initial plenum;
    c) a capacitive sensor positioned within the initial plenum;
    d) a planten for supporting a polishing surface; and
    e) a motion generator for causing relative motion between the wafer and the polishing surface.
13. The apparatus of claim 12 further comprising:
    f) at least one annular rib extending from the body to the membrane thereby dividing the initial plenum into a plurality of plenums.
14. The apparatus of claim 12 wherein the sensor is mounted to the body.
15. The apparatus of claim 12 wherein the membrane has a notch for receiving a portion of the sensor.
16. The apparatus of claim 13, further comprising:
    e) a pump; and
    f) a pathway from the pump to one of the plurality of plenums.
17. The apparatus of claim 12 wherein the motion generator orbits the polishing surface.
18. The apparatus of claim 12 wherein the motion generator rotates the polishing surface.
19. The apparatus of claim 12 wherein the motion generator linearly moves the polishing surface.
20. An apparatus for planarizing a front surface of a wafer comprising:
    a) a body having a cavity;
    b) a membrane, for supporting a wafer, covering the cavity thereby forming an initial plenum;
    c) a sensor positioned within the initial plenum;
    d) a planten for supporting a polishing surface;
    e) a motion generator for causing relative motion between the wafer and the polishing surface;
    f) a carousel apparatus for transporting the body to the polishing surface; and
    g) at least one annular rib extending from the body to the membrane thereby dividing the initial plenum into a plurality of plenums.
21. The apparatus of claim 20 wherein the sensor comprises a capacitive sensor.
22. The apparatus of claim 20 wherein the sensor is mounted to the body.
23. The apparatus of claim 20 wherein the membrane has a notch for receiving a portion of the sensor.
24. The apparatus of claim 20 further comprising:
    g) a pump; and
    h) a pathway from the pump to one of the plurality of plenums.
25. The apparatus of claim 20 wherein the motion generator orbits the polishing surface.
26. The apparatus of claim 20 wherein the motion generator rotates the polishing surface.
27. The apparatus of claim 20 wherein the motion generator linearly moves the polishing surface.
28. An apparatus for planarizing a front surface of a wafer comprising:
    a) a body having a cavity;
    b) a membrane, for supporting a wafer, covering the cavity thereby forming an initial plenum;
    c) a capacitive sensor positioned within the initial plenum;
    d) a platen for supporting a polishing surface;
    e) a motion generator for causing relative motion between the wafer and the polishing surface; and
    f) a manifold positioned beneath the platen for distributing a fluid to the polishing surface.

29. The apparatus of claim 28 further comprising:
g) at least one annular rib extending from the body to the membrane thereby dividing the initial plenum into a plurality of plenums.

30. The apparatus of claim 28 wherein the sensor is mounted to the body.

31. The apparatus of claim 28 wherein the membrane has a notch for receiving a portion of the sensor.

32. The apparatus of claim 29 further comprising:
g) a pump; and
h) a pathway from the pump to one of the plurality of plenums.

33. The apparatus of claim 28 wherein the motion generator orbits the polishing surface.

34. The apparatus of claim 28 wherein the motion generator rotates the polishing surface.

35. The apparatus of claim 28 wherein the motion generator linearly moves the polishing surface.

36. A method of detecting whether a wafer is present in a carrier comprising the steps of:
a) positioning a back surface of a wafer against a membrane of a carrier; and
b) capacitively sensing whether the wafer is present in the carrier through the use of a capacitive sensor.

37. A method of detecting whether a wafer is present in a carrier comprising the steps of:
a) positioning a back surface of a wafer against a membrane of a carrier having a first and second plenum;
b) applying a first pressure in the first plenum sufficient to retain the wafer by creating a partial vacuum between the membrane and the wafer; and
c) capacitively sensing whether the wafer is present in the carrier.

38. The method of claim 37 further comprising the step of:
d) prior to step c), applying a second pressure in the second plenum, wherein the second pressure is sufficient to urge the membrane away from the sensor if the wafer is not retained in the carrier and is insufficient to urge the membrane away from the sensor if the wafer is retained in the carrier.

39. The method of claim 38 further comprising the step of polishing the wafer if the wafer is retained in the carrier.

40. The method of claim 38 further comprising the step of terminating the polishing procedure if the wafer is not retained in the carrier.

* * * * *